(12) United States Patent
Savanth et al.

(10) Patent No.: US 10,664,031 B2
(45) Date of Patent: May 26, 2020

(54) MONITORING CIRCUIT AND METHOD

(71) Applicant: ARM Limited, Cambridge (GB)

(72) Inventors: Parameshwarappa Anand Kumar Savanth, Cambridge (GB); Bal S. Sandhu, Fremont, CA (US); James Edward Myers, Cambridge (GB); Alexander Stewart Weddell, New Milton (GB); David Walter Flynn, Cambridge (GB)

(73) Assignee: ARM Limited, Cambridge (GB)

( * ) Notice: Subject to any disclaimer, the term of this patent is extended or adjusted under 35 U.S.C. 154(b) by 19 days.

(21) Appl. No.: 15/361,405

(22) Filed: Nov. 26, 2016

(65) Prior Publication Data

US 2018/0150120 A1 May 31, 2018

(51) Int. Cl.
*G06F 1/00* (2006.01)
*G06F 1/28* (2006.01)
*G01R 19/165* (2006.01)

(52) U.S. Cl.
CPC ......... *G06F 1/28* (2013.01); *G01R 19/16576* (2013.01)

(58) Field of Classification Search
CPC ........................................................ G06F 1/32
See application file for complete search history.

(56) References Cited

U.S. PATENT DOCUMENTS

| | | | | |
|---|---|---|---|---|
| 8,076,970 B2 * | 12/2011 | Sbuell | ...................... | H03D 1/00 329/365 |
| 2009/0089599 A1 | 4/2009 | Westwick et al. | | |
| 2014/0035560 A1 | 2/2014 | Olmos et al. | | |
| 2014/0139201 A1 | 5/2014 | Wadhwa et al. | | |
| 2015/0311795 A1 * | 10/2015 | Yang | ..................... | H02M 3/156 323/271 |
| 2017/0185094 A1 * | 6/2017 | Atkinson | .................. | G05F 1/59 |
| 2017/0295503 A1 * | 10/2017 | Govindaraju | ........... | H04L 67/12 |
| 2017/0353107 A1 * | 12/2017 | Shao | ..................... | H02M 3/157 |

OTHER PUBLICATIONS

PCT International Search Report and Written Opinion; PCT/GB2017/053446; dated Feb. 7, 2018.
Lee, et aL; Low Power Battery Supervisory Circuit with Adaptive Battery Health Monitor; 2014 Symposium on VLSI Circuits Digest of Technical Papers; Jun. 2014.

(Continued)

*Primary Examiner* — Mohammed H Rehman
(74) *Attorney, Agent, or Firm* — Pramudji Law Group PLLC; Ari Pramudji

(57) ABSTRACT

Broadly speaking, embodiments of the present techniques provide a voltage monitoring circuit for low power minimum-energy sensor nodes. The circuit comprises sensing circuitry to sense a monitored signal having a plurality of operating signal states; a first comparator having a first input for receiving an upper threshold signal; and a second comparator having a first input for receiving a lower threshold signal, the upper and lower threshold signals defining a range which includes at least one signal state of the plurality of operating states of the monitored signal, wherein the first and second comparators have a bias input for receiving a bias configuration setting, the bias configuration setting being selectable according to an operating signal state of the monitored signal.

22 Claims, 14 Drawing Sheets

(56) References Cited

OTHER PUBLICATIONS

Mishra, et al.; A Sub-µA Power Management Circuit in 0.18µm CMOS for Energy Harvesters in Design; 2013 Design, Automation Test in Europe Conference Exhibition; pp. 1197-1202; Mar. 2013.
Lee, et aL; A 635pW Battery Voltage Supervisory Circuit for Miniature Sensor Nodes; 2012 Symposium on VLSI Circuits; pp. 202-203; Jun. 2012.
Le, et aL; A Long Reset-Time Power-On Reset Circuit with Brown-Out Detection Capability; IEEE Transactions on Circuits and Systems II: Express Briefs; vol. 58, No. 11; pp. 778-782; Nov. 2011.
Guo, et al; Power-On-Reset Circuit with Power-off Auto-Discharging Path for Passive RFID Tag ICs; 53rd IEEE international Midwest Symposium on Circuits and Systems; pp. 21-24; Aug. 2010.

\* cited by examiner

MONITORING CIRCUIT AND METHOD

The present techniques generally relate to apparatus and methods enabling minimum energy operation of sensor nodes. Such sensor nodes are typically found in small, low-cost and energy efficient wireless networks and are an important part of the Internet of Things (IoT).

Recent works have demonstrated central processing unit (CPU) designs that operate at supply voltages below transistor threshold voltages such as sub-550 mV. Such operation enables minimum energy operation which is good for sensors that are energy constrained and have low activity rates. These sensors may also harvest energy from their environment and have very extended lifetimes. Minimising leakage energy is important to such CPU designs because a sensor node may spend extended time in a sleep mode and leakage energy increases exponentially at low voltages. To minimise leakage, it is known to use fine-grained power gating in multiple power domains, and an integrated voltage regulator is often used to obtain the low voltage (Vreg) required for sub-threshold operation and to reduce off-chip interface latency during sleep and active mode transitions. Fast wide-range dynamic voltage scaling is used for wireless sensor nodes to enable frequent entry into sleep modes and to maximise sleep time.

Enabling the clock to the CPU-system upon wake-up requires care because an early enable may cause timing violations, whilst a delayed enable may cause high energy consumption. Voltage monitors are typically used in conjunction with a voltage regulator to confirm desired regulator voltage (Vreg) levels before the clock is enabled.

Voltage monitors typically use comparators with factory-trimmed threshold voltages for detecting an unsafe rail voltage condition. Sensing slow rising or non-monotonic rail voltages can cause oscillations as rail voltage approaches comparator threshold voltage. This may be addressed by using two comparators with slightly offset threshold voltages. This two-level monitoring adds hysteresis to the comparator, but allows only for a low-voltage unsafe condition to be monitored. For minimum energy sensor nodes however, it is necessary to independently monitor for over-voltage conditions as well since excess leakage can adversely affect operation. In the conventional scheme this would require four comparators making monitoring an energy expensive task.

Present techniques disclose a low-power monitoring circuit and scheme, such as a voltage or current monitoring circuit which may form part of a power management unit (PMU) interfacing with a CPU system used to control minimum energy sensor nodes.

The techniques are diagrammatically illustrated, by way of example, in the accompanying drawings and embodiments, in which.

Figure 1:
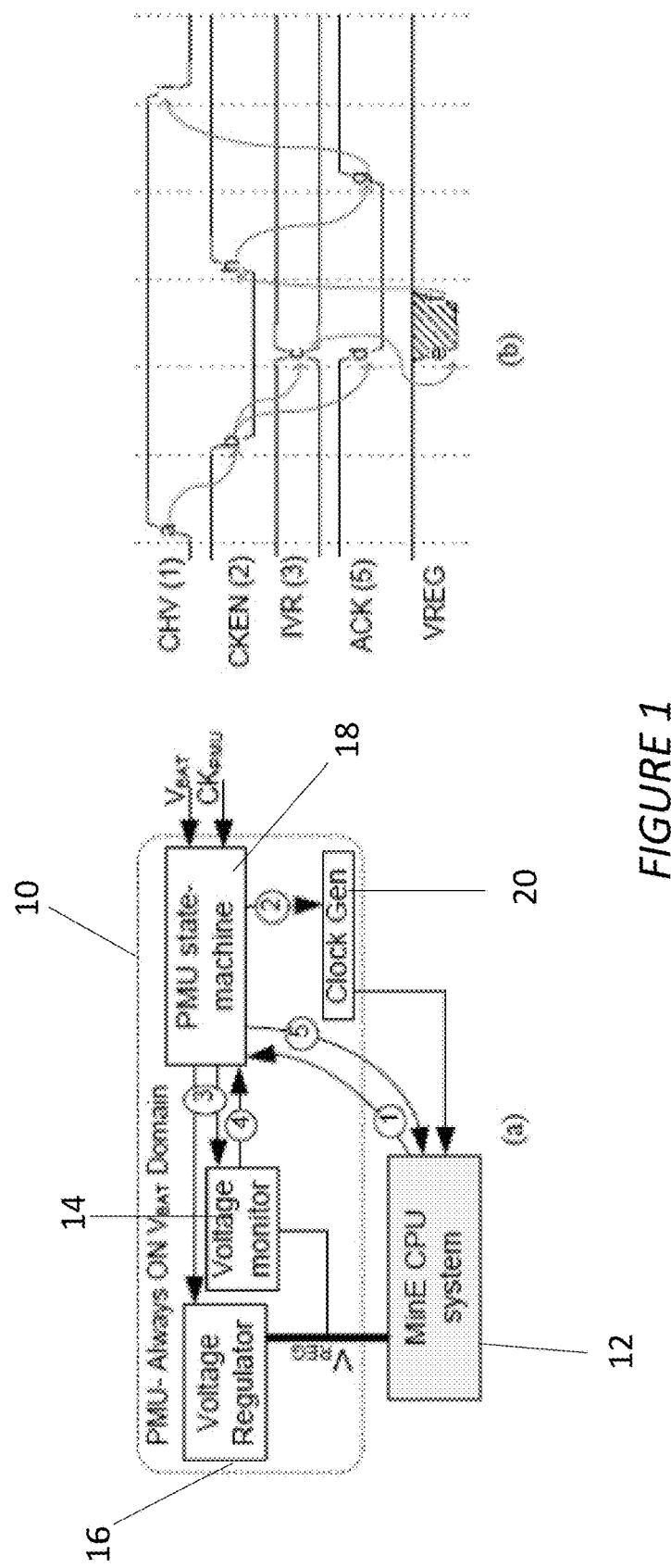
FIG. 1a is a voltage monitoring power management unit block diagram.
FIG. 1b is a schematic diagram of theoretical mode transition waveforms during dynamic voltage scaling.

FIG. 1a is a voltage monitoring power management unit (PMU) 10 interfacing with a CPU-system 12 and comprising a voltage monitor 14. The PMU 10 further comprises an integrated voltage regulator 16, PMU state machine 18 and CPU-system clock generator 20.

Under ideal conditions, (FIG. 1b) the CPU-system 12 asserts voltage change request CHV (1) when a mode change is desired. The change request CHV (1) is captured by the PMU state machine 18 and CPU-system clock 20 is disabled CKEN (2). The integrated voltage regulator 16 setting IVR (3) is then changed to a requested value while de-asserting the ACK (5) signal. Assuming a system rail voltage VREG settles immediately, CKEN (2) is asserted followed by ACK (5). The CPU-system 12 resumes in the requested mode and CHV (1) is de-asserted. In such an ideal case, then no voltage monitoring scheme may be necessary.

Figure 2:
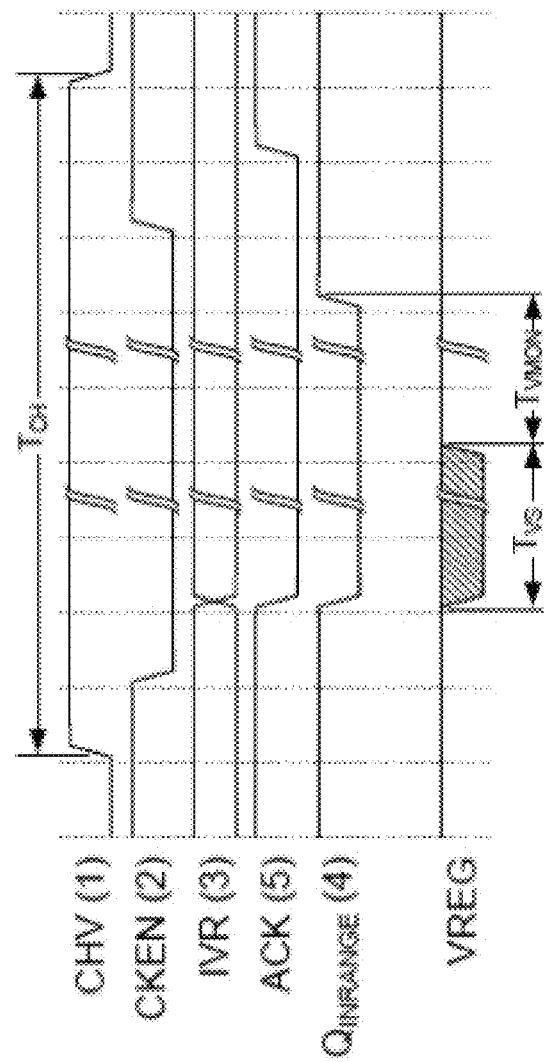
FIG. 2 is a schematic diagram of mode transition waveforms for practical voltage regulator characteristics.

Referring to FIG. 2, a schematic diagram of mode transition waveforms for typical voltage regulator characteristics illustrates that the transition time is much longer, being dominated by the voltage settling time ($T_{VS}$) and the time it takes for the voltage monitor 14 to detect an in-range condition ($T_{VMON}$). It is preferable to minimize $T_{VS}$ and $T_{VMON}$. $T_{VS}$ is affected by load current which is sensitive to temperature, process and system work-loads and IVR design characteristics such as output impedance and on/off-chip decoupling capacitance. Techniques disclosed herein seek to minimise $T_{VMON}$.

Figure 3:
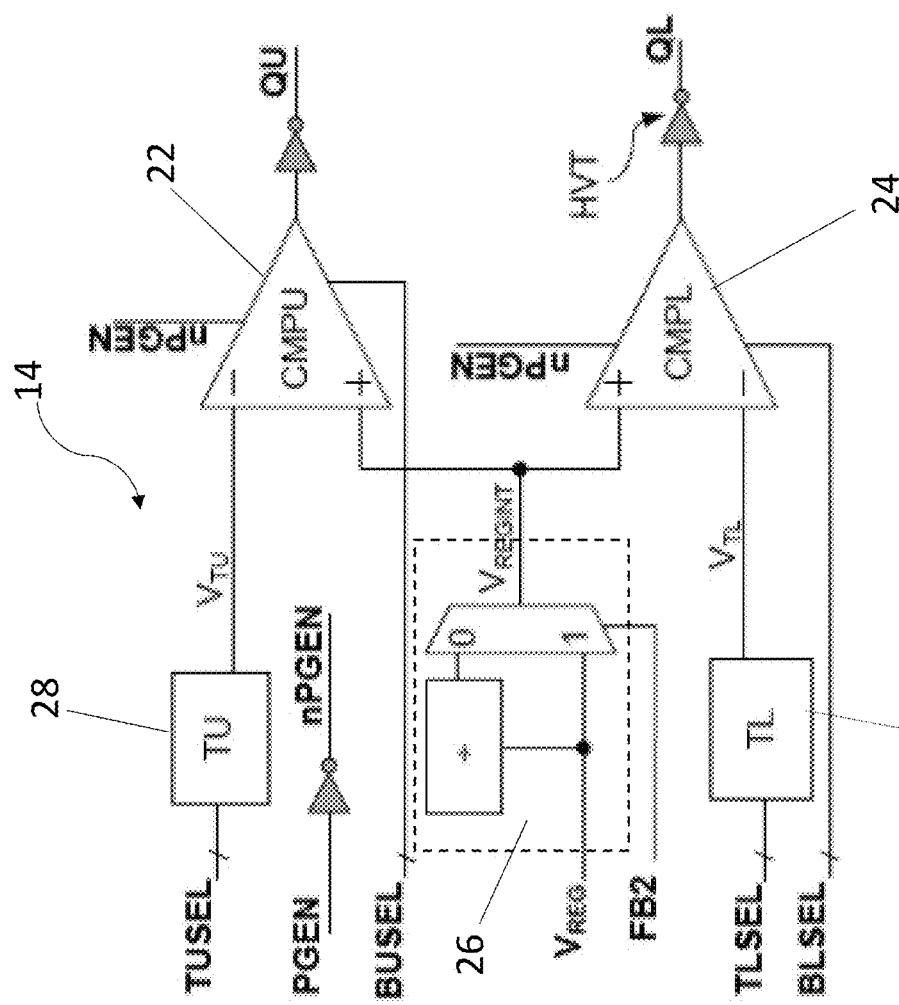
FIG. 3 is a schematic diagram of a voltage monitoring circuit.

Present techniques use reference tuning to add hysteresis, allowing both upper and lower limits to be monitored using two comparators. FIG. 3 is a schematic diagram of a voltage monitoring circuit 14 according to present techniques.

Referring to FIG. 3, the voltage monitoring circuit 14 comprises upper threshold comparator 22 and lower threshold comparator 24. Signals QU and QL are outputs of the upper and lower threshold comparators 22, 24 respectively and are monitored by the PMU state machine 18 (not shown in FIG. 3). A sense voltage divider 26 comprises an output coupled to a positive input terminal of both the upper and lower threshold comparators 22, 24 and input Vreg being a rail voltage being monitored.

The upper and lower comparison thresholds, $V_{TU}$ for the upper comparator 22 and $V_{TL}$ for the lower comparator 24 can be programmed using signals TUSEL and BLSEL respectively coupled to the comparators 22, 24 by threshold upper module 28 and threshold lower module 30. A tunable range between $V_{TU}$ and $V_{TL}$ covers the entire dynamic voltage scaling (DVS) range of the CPU-system 12. Additionally, bias current selection bits BUSEL and BLSEL for both upper comparator 22 and lower comparator 24 are coupled to an input of the respective comparator 22, 24 and used to minimise the quiescent power of the voltage monitor 14 whilst maintaining high monitoring speed.

The upper and lower comparators 22, 24 can be power gated using a PGEN and nPGEN signal. This can minimise static power when the voltage monitor 14 is power gated such as in a system deep-sleep mode. In this mode, the integrated voltage regulator 16 is OFF and so the voltage monitoring circuit 14 can be powered down.

Figure 4:
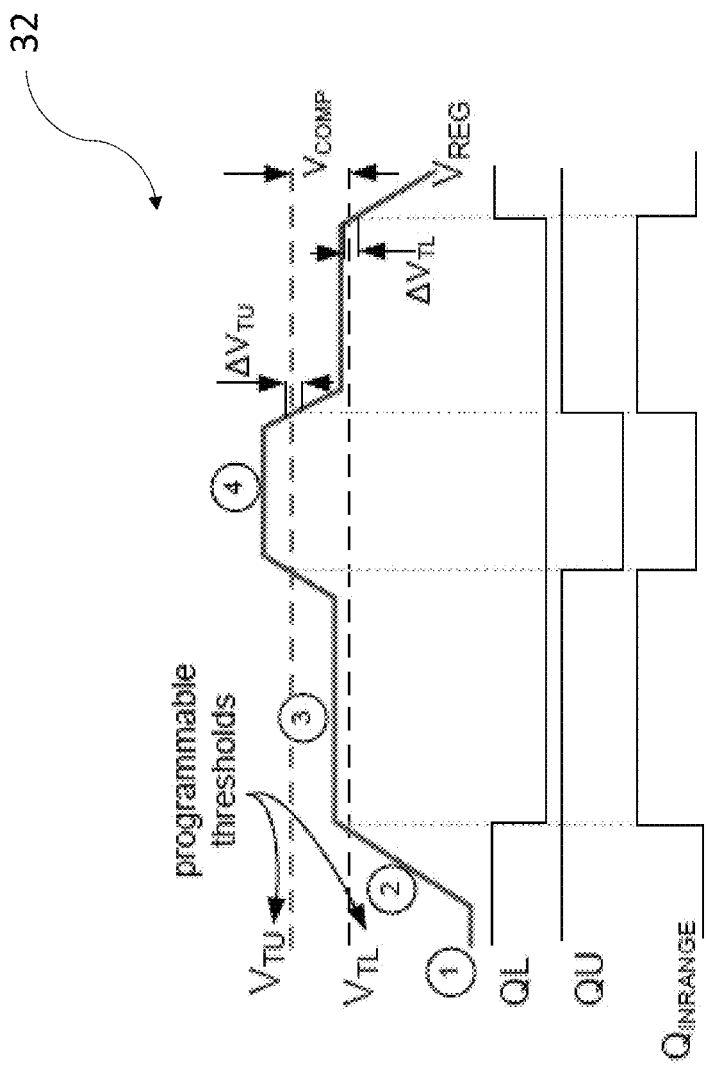
FIG. 4 is a schematic diagram of a voltage monitor response waveform for varying regulator voltage levels.

FIG. 4 is a diagram of the voltage monitor 14 response waveform 32 for varying VREG levels. For sake of simplicity VREG is shown to start at a voltage below $V_{TL}$. The output signals QU and QL are both high and QINRANGE is de-asserted, indicating an out-of-range or unsafe condition for enabling the CPU-system clock 20. In this state (1) both upper and lower comparators 22, 24 are OFF. As VREG starts rising (state (2)) the first event is triggered when VREG>$V_{TL}$. This event is signalled by the lower threshold comparator 24. Thus the PMU 10 can power-down the upper threshold comparator 24 until this event occurs, thus reducing the voltage monitor 14 quiescent power. Once VREG is within the desired limits, state (3), both the upper and lower threshold comparators 22, 24 are turned ON but in a low-bandwidth mode to satisfy μs order detection of an out-of-range condition. When VREG exceeds $V_{TU}$ state (4), the lower threshold comparator 24 is powered down as the trigger can be reliably generated by the upper threshold comparator 22 when VREG drops below $V_{TU}$. Thus, present techniques allow exploiting current-state awareness in the PMU 10 to minimize quiescent power in the voltage monitoring circuit 14.

A state (3)-(2) transition may be fatal to the system while a (3)-(4) transition is less critical. The CPU-system 12 remains functional in state (4) but potentially at a much higher energy cost. Therefore, in state (3) the upper threshold comparator 22 quiescent current may be further reduced. Present techniques allow any number, in the present case three, of bias current settings to be dialled into the comparators 22, 24. A BxSEL setting of '3' provides fastest response at highest quiescent power and a setting of '1' provides lowest power operation. Table I summarizes the bias configuration for each state as highlighted in FIG. 4.

TABLE I

| State | Upper Threshold Comparator | Lower Threshold Comparator | $\Delta V_{TU}$ | $\Delta V_{TL}$ |
|---|---|---|---|---|
| 1 | 0 | 0 | — | — |
| 2 | 0 | 3 | — | +ΔV |
| 3 | 1 | 2 | +ΔV | −ΔV |
| 4 | 3 | 0 | −ΔV | — |

Hysteresis may be added depending on the corresponding comparator output QU, QL, and present techniques use TxSEL bits for achieving the hysteresis. Thus state (2)-(3) transition is at $V_{TL}$ plus a small voltage (ΔV) while a (3)-(2) transition is at $V_{TL}$-ΔV. Similarly (3)-(4) occurs at $V_{TU}$+ΔV and (4)-(3) at $V_{TU}$-ΔV, thus preventing any oscillations. This is indicated in Table I as $\Delta V_{Tu}$ and $\Delta V_{TL}$.

Figure 5:
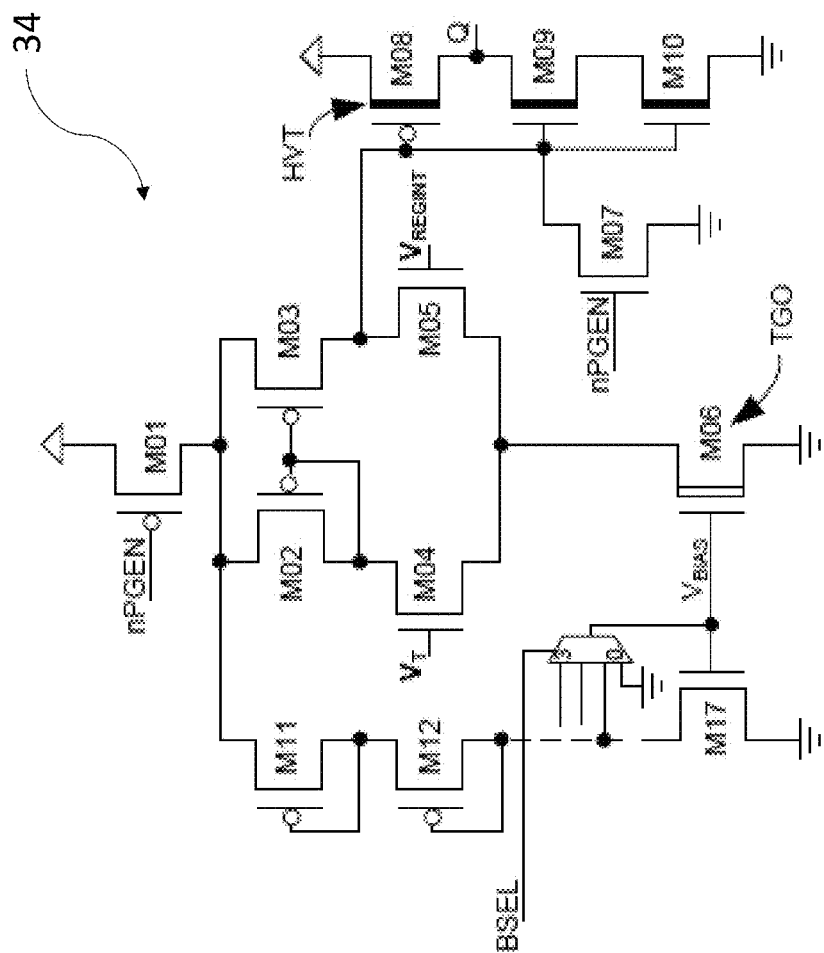
FIG. 5 is a schematic diagram of a comparator circuit.

Referring to FIG. 5, a schematic diagram is shown of a comparator circuit 34 according to present techniques and capable of providing an upper or lower threshold comparator 22, 24. The upper or lower threshold comparator 22, 24 comprises a tail-current transistor M06 as a thick gate oxide (TGO) device to allow for better $V_{BIAS}$ control of tail current. In operation, the bias selection bits BxSEL effectively change the mirror ratio between M17 and M6, controlling response speed of the comparator circuit 34 and its quiescent current. A stack of 6 diode-connected voltage threshold transistors (M11-M17) is used for bias generation. An input differential pair (M4, M5) according to present techniques use NMOS transistors and the lack of gain is compensated by using large low threshold voltages devices. This allows input voltages, such as to 0.2 V, to be sensed reliably. The output of the differential stage drives an inverter 36 comprising stacked voltage threshold devices (M8-M10), which limits short-circuit current and helps reduce power. M01 and M07 allow the comparator 34 to be power gated with Q forced high.

Figure 6:
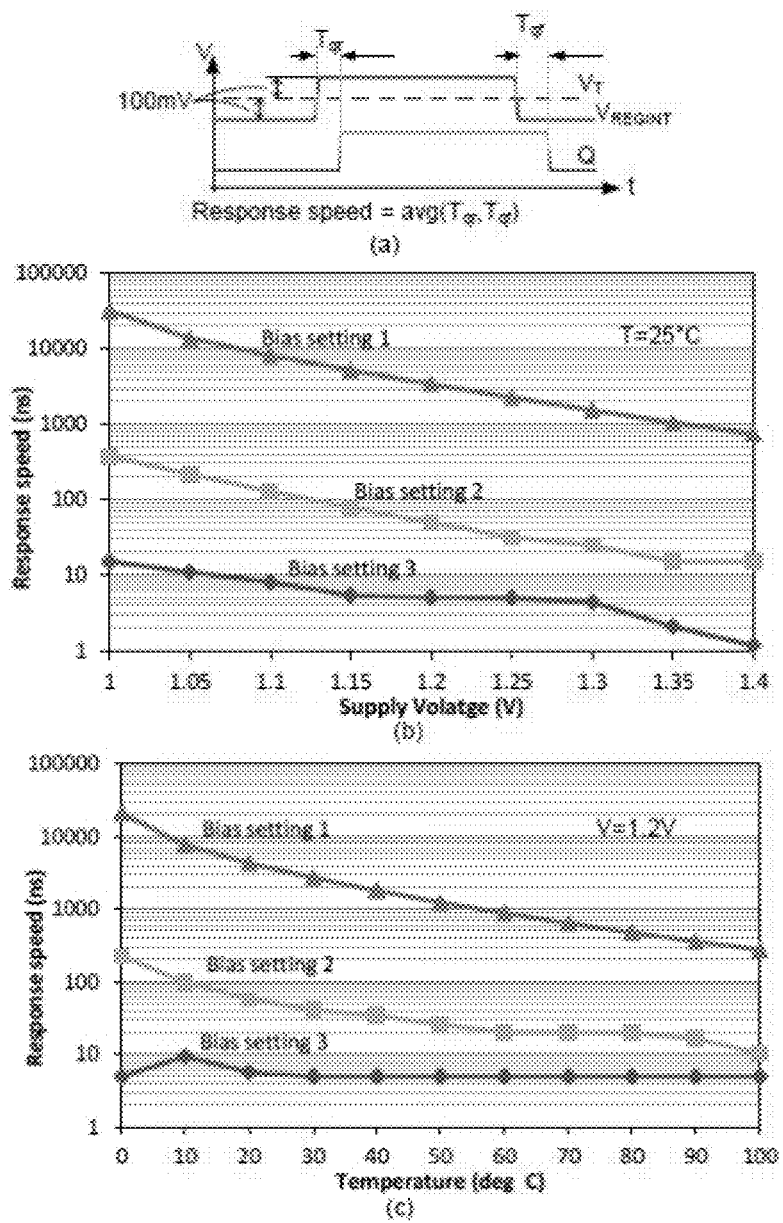
FIG. 6a is a graph of comparator simulation results for response speed vs supply voltage, FIG. 6b speed vs temperature for different bias configuration settings
FIG. 6c shows the response speed with varying temperature for different bias.

FIG. 6a is a graph of comparator simulation results for response speed vs. supply voltage, FIG. 6b is a graph of speed vs. temperature and FIG. 6c shows the response speed with varying temperature for different bias configuration settings. FIG. 6a shows simulation results for supply voltage of 1.0-1.4 V and temperature range of 0-100 C. Response speed is measured as the average delay for a correct transition on Q for VREGINT change from VT-100 mV to VT+100 mV. FIG. 6b shows the comparator response speed against supply voltage variation (T=25 C). At sufficiently large tail currents the comparator speed is less affected by temperature. Both speed and quiescent power increase exponentially with bias setting so speed can be traded with power. Another consequence of reducing power is the increased sensitivity of comparator speed to voltage and temperature.

Figure 7:
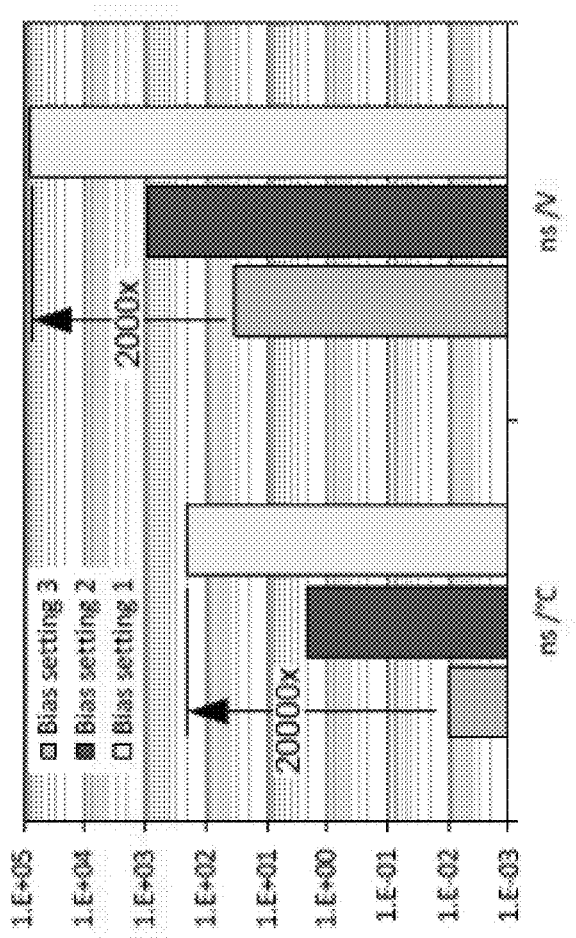
FIG. 7 is a graph of comparator simulation results for sensitivity of response speed to supply voltage and temperature for different bias settings.

FIG. 7 is a graph of comparator simulation results for sensitivity of response speed to supply voltage and temperature for different bias settings, and simulation results show a 20,000× increase in sensitivity with temperature and 2,000× increase for voltage. However, since present techniques rely on using low bias current modes only when comparator response is less critical or is not needed, this increased sensitivity does not affect system active-sleep-active transitions.

FIG. 8a is a schematic diagram of an internal threshold voltage generator and FIG. 8b of a voltage divider according to present techniques. Referring to FIG. 8a, an internal threshold voltage generator 38 shows that both $V_{TU}$ and $V_{TL}$ are obtained from the lower half of the stack to give identical behaviour as temperature varies. For a nominal supply voltage of 1.2 V all transistors in the stack operate in sub-threshold regime. PMOS devices are used in source-connected isolated N-wells to avoid body effects and ease layout. Each node in the divider stack is decoupled using 20 fF MOS capacitors to provide rejection of high frequency supply ripple. Further, the ON resistance of the multiplexers and a 120 fF capacitance on the output node mitigates noise on the reference node.

The speed and accuracy of comparison depends on the comparator 22, 24 and the threshold voltage generator 38. The comparators 22, 24 use large devices, common-centroid matched layout, guard rings and dummy devices with sufficient distance between active devices and the well edges minimising well-proximity effects. Thus comparator variation contributing to variation in trip points is minimized. The threshold voltage generator 38 on the other hand uses devices in isolated wells which are not matched in layout. They are more prone to on-chip variation. Thus accuracy of comparison is largely determined by variations in the threshold voltage generator 38.

Figure 9:
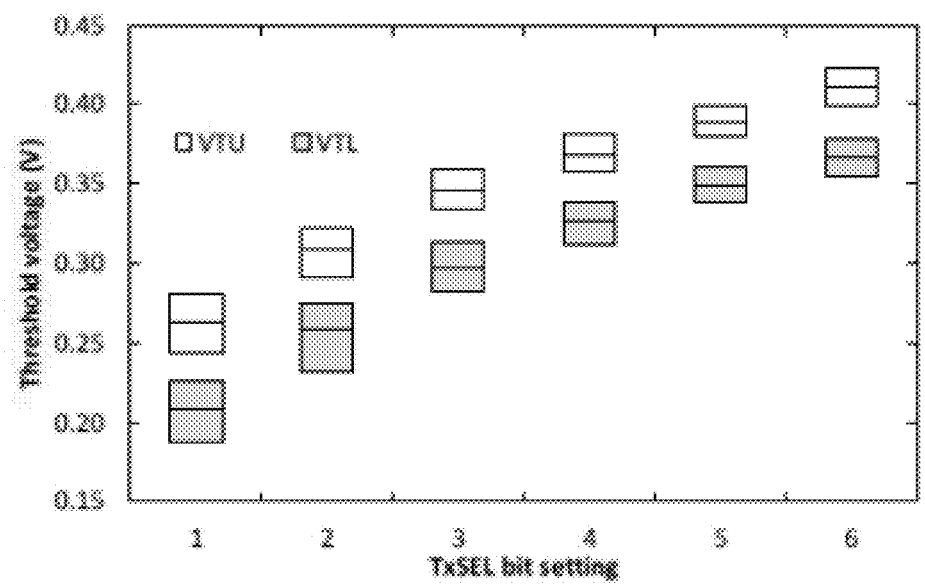
FIG. 9 is a graph of spread of upper and lower threshold voltage levels for over a 1000 monte-carlo simulations.

FIG. 9 is a graph of spread of upper and lower threshold voltage levels for over a 1000 monte-carlo simulations. Referring to FIG. 9 the worst case spread for $V_{TL}$ is about 60 mV and 64 mV for $V_{TU}$. For both $V_{TU}$ and $V_{TL}$, the box height shows the spread with centre bar indicating the corresponding mean. For the same threshold voltage setting $V_{TU}$ and $V_{TL}$ do not overlap, meaning the circuit will always provide a reliable comparison window (VCOMP). The mean values for VCOMP and the corresponding hysteresis (ΔV) obtained from simulations is tabulated in Table II.

TABLE II

| TxSEL | | 1 | 2 | 3 | 4 | 5 | 6 |
|---|---|---|---|---|---|---|---|
| $V_{COMP}$ (mV) | μ | 54 | 48 | 44 | 42 | 41 | 42 |
| | σ | 4 | 4 | 4 | 3 | 3 | 3 |
| $ΔV_{TU}$ (mV) | μ | 45 | 79 | 59 | 44 | 36 | 34 |
| | σ | 4 | 6 | 5 | 4 | 4 | 3 |
| $ΔV_{TL}$ (mV) | μ | 50 | 89 | 68 | 51 | 40 | 33 |
| | σ | 5 | 6 | 5 | 5 | 4 | 4 |

Figure 8:
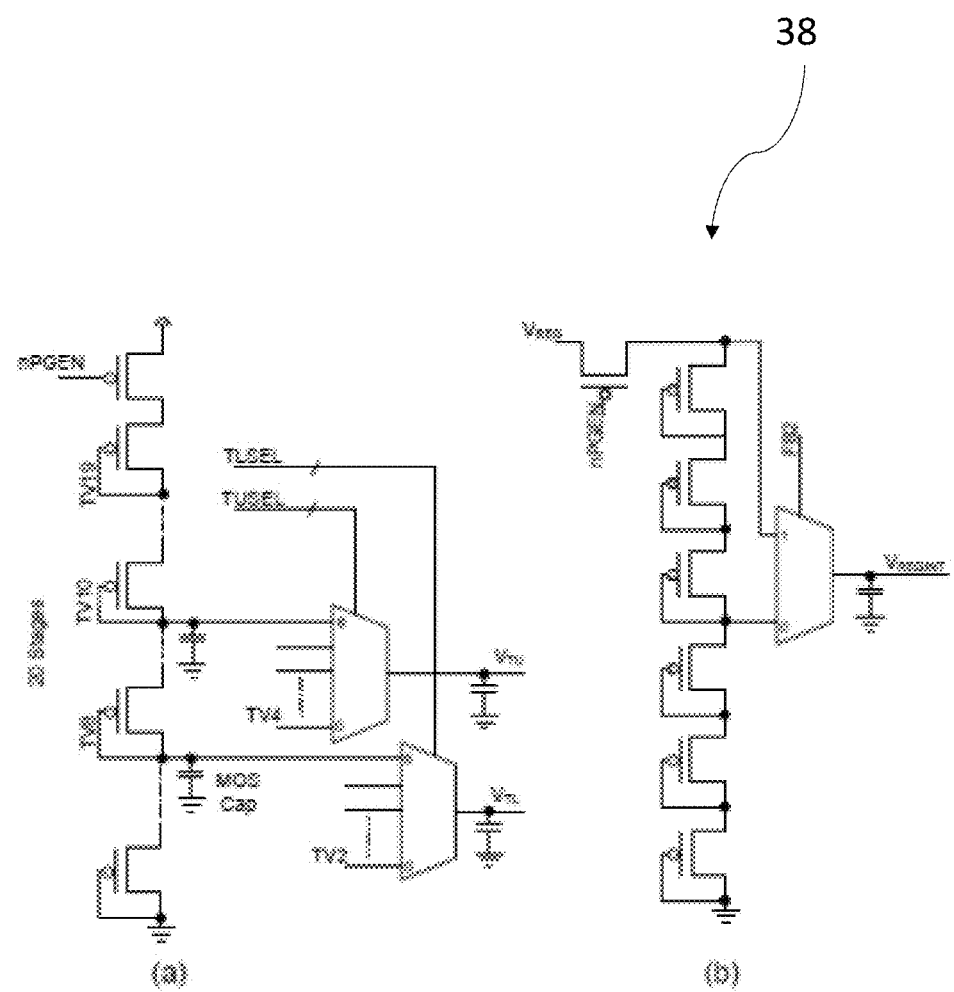
FIG. 8a is a schematic diagram of an internal threshold voltage generator and FIG. 8b of a voltage divider.

For VREG greater than approximately VBAT/2, the comparator sense voltage is divided by 2 using input FB2 (as shown in FIG. 3). Since the divided version of VREG is obtained at the midpoint of the diode stack (as shown in FIG. 8), the ratio remains independent of temperature and VREG.

Figure 10:
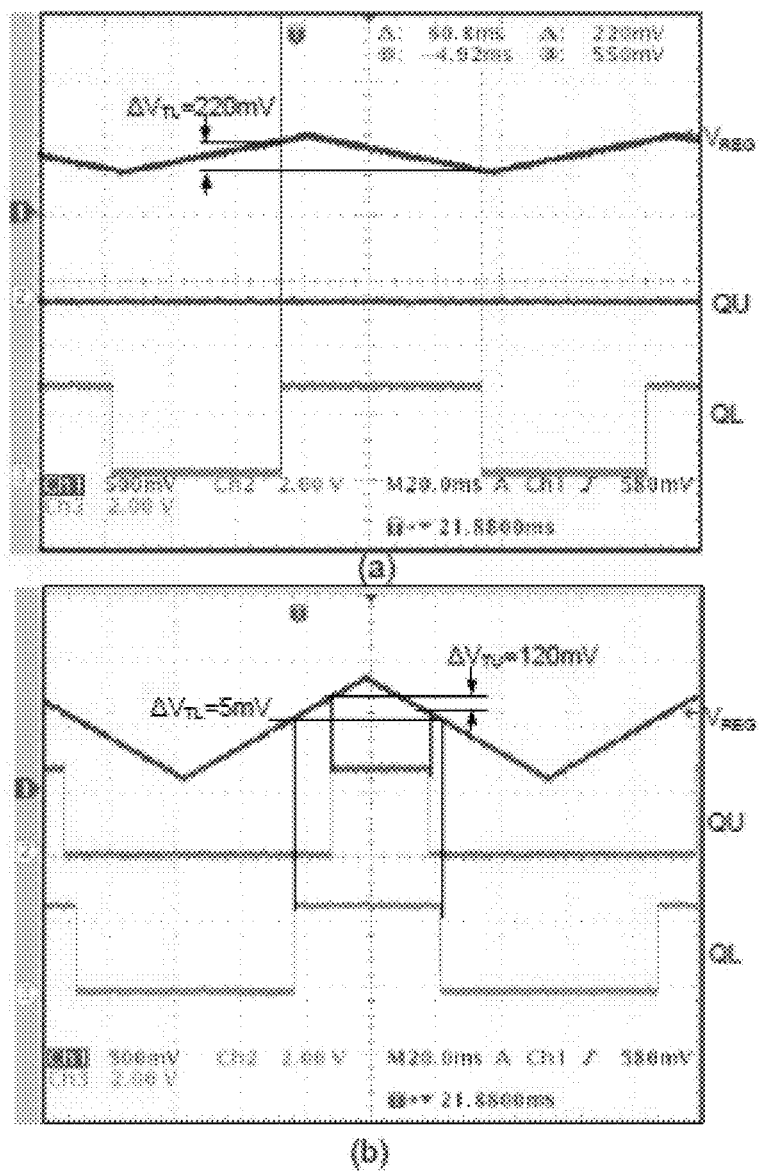
FIG. 10 is a graph of measured DC results for differing operating states.

FIG. 10 is a graph of measured DC results for differing operating states according to present techniques. FIG. 10 illustrates DC results for two cases: (a) with VREG increasing up to the desired range before decreasing and (b) with VREG increasing beyond the desired range (over-voltage). FIG. 10a shows a ΔTL of 220 mV. However when VREG exceeds $V_{TU}$ (FIG. 10b) $V_{TL}$ is redundant and is reduced to 5 mV. A 120 mV $ΔV_{TU}$ prevents QU from oscillating. Note that QINRANGE is asserted only for $V_{TL}$<VREG<$V_{TU}$.

Figure 11:
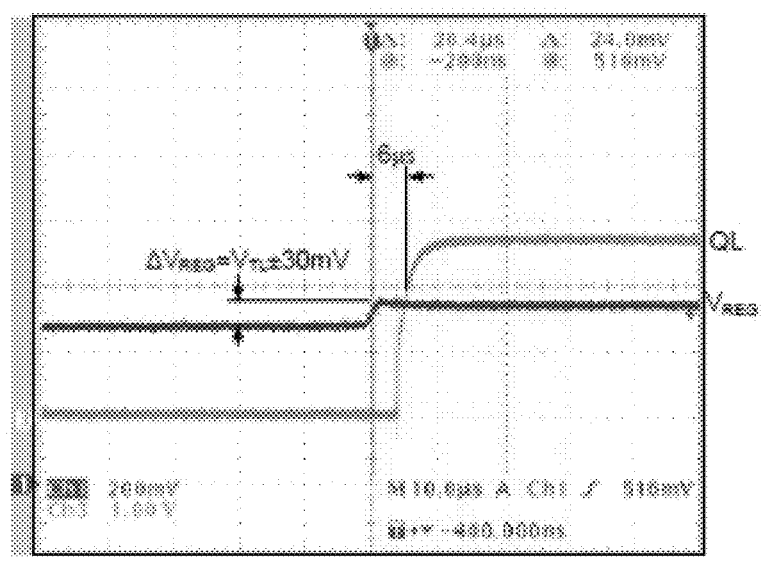
FIG. 11 is a graph of measured transient results of a comparator speed for a configuration setting.

FIG. 11 is a graph of measured transient results of a comparator speed for a bias configuration setting according to techniques. FIG. 11 shows the transient results with VREG transitioning from $V_{TL}$-30 mV to $V_{TL}$+30 mV. Since this does not exceed $V_{TU}$, QL determines QINRANGE. Note that the delay in detecting an in-range condition is 6 μs (1.2 V, room temperature).

Figure 12:
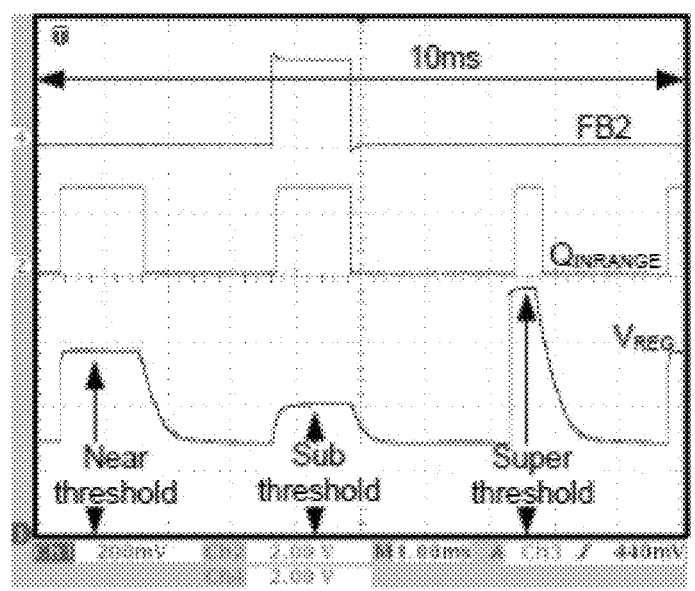
FIG. 12 is a schematic diagram of voltage monitor response for regulator voltage transitioning from retention to super-threshold voltages.

FIG. 12 is a schematic diagram of voltage monitor response for regulator voltage transitioning from retention to super-threshold voltages. $V_{REG}$ transitions from 0.3 V retention voltage to 0.4 V, 0.6 V and 0.8 V in 10 ms. In each mode the voltage monitor correctly detects an in-range and out-of-range condition (upper and lower limits). Note that FB2 is asserted for 0.4 V to bypass the divider. Mode transitions at 0.8 V are sub-μs order as dictated by higher CPU clock frequencies achievable at super-threshold voltages.

Figure 13:
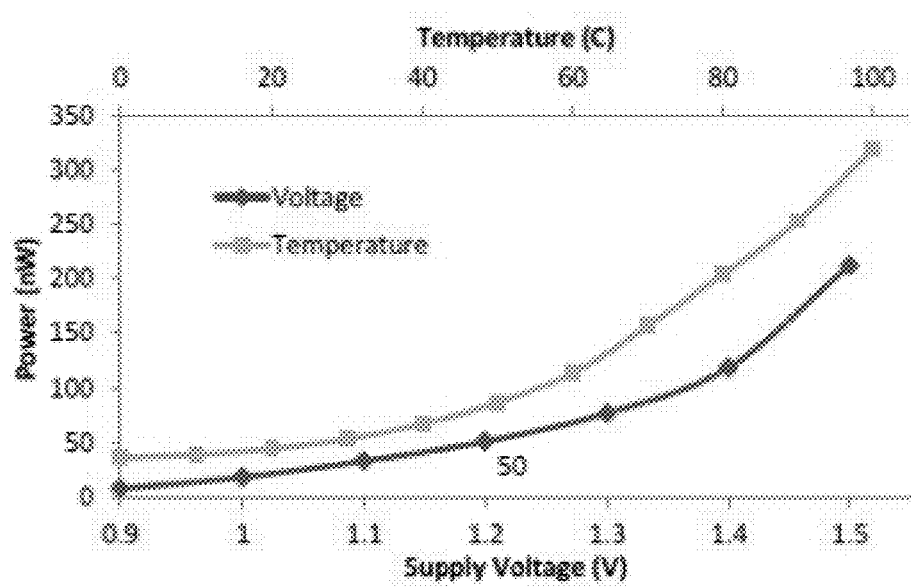
FIG. 13 is a graph of measured power for voltage and temperature for a voltage monitor.

The voltage monitor has highest energy consumption (power times duration) in state 3 when CMPU and CMPL have bias settings of 1 and 2 (Table I). The voltage monitor consumes 50 nW in this setting at 1.2 V as shown in FIG. 13, a graph of measured power for voltage and temperature for a voltage monitor. Variation of quiescent power with supply voltage and temperature is also shown. The proposed design is compared with state-of-the-art in Table III. The energy expended while waiting for a response from the monitor (Ewait) is the lowest for present techniques.

TABLE III

| | [1] | [2] | [3] | [4] | [5] | Present techniques |
|---|---|---|---|---|---|---|
| Node (nm) | 180 | 180 | 180 | 90 | 180 | 65 |
| $V_{DD}$ (V) | 1.8 | 3.6 | 1.8 | 1.0 | 3.6 | 1.2 |
| Delay (s) | 0.1 | 1.94 | 0.35 | 500 | 0.05 | 6 |
| Power (nW) | 3600 | 0.63 | 650 | 540 | 3.6 | 50 |
| Area (sq.mm) | 0.012 | 0.009 | NR | 0.088 | 0.17 | 0.002 |
| ΔV (mV) | NR | 200 | 66 | 432 | 77 | Configurable |
| $E_{WAIT}$ nJ) | 180 | 1.2 | 2.5 | 0.11 | 0.17 | 0.3 m |

(NR: not reported)

References for comparison in Table III and FIG. 15:

[1]—H. B. Le, X. D. Do, S. G. Lee, and S. T. Ryu, "A Long Reset-Time Power-On Reset Circuit with Brown-Out Detection Capability," IEEE Transactions on Circuits and Systems II: Express Briefs, vol. 58, no. 11, pp. 778-782, November 2011.

[2]—I. Lee, S. Bang, Y. Lee, Y. Kim, G. Kim, D. Sylvester, and D. Blaauw, "A 635 pW Battery Voltage Supervisory Circuit for Miniature Sensor Nodes," in 2012 Symposium on VLSI Circuits (VLSIC), June 2012, pp. 202-203.

[3]—B. Mishra, C. Botteron, G. Tasselli, C. Robert, and P. A. Farine, "A Sub-UA Power Management Circuit in 0.18 um CMOS for Energy Har-vesters," in Design, Automation Test in Europe Conference Exhibition (DATE), 2013, March 2013, pp. 1197-1202.

[4]—J. Guo, W. Shi, K. N. Leung, and C. S. Choy, "Power-On-Reset Circuit with Power-off Auto-Discharging Path for Passive RFID Tag ICs," in 2010 53rd IEEE international Midwest Symposium on Circuits and Systems, August 2010, pp. 21-24.

[5]—I. Lee, Y. Lee, D. Sylvester, and D. Blaauw, "Low Power Battery Supervisory Circuit with Adaptive Battery Health Monitor," in 2014 Symposium on VLSI Circuits Digest of Technical Papers, June 2014, pp. 1-2.

Figure 14:
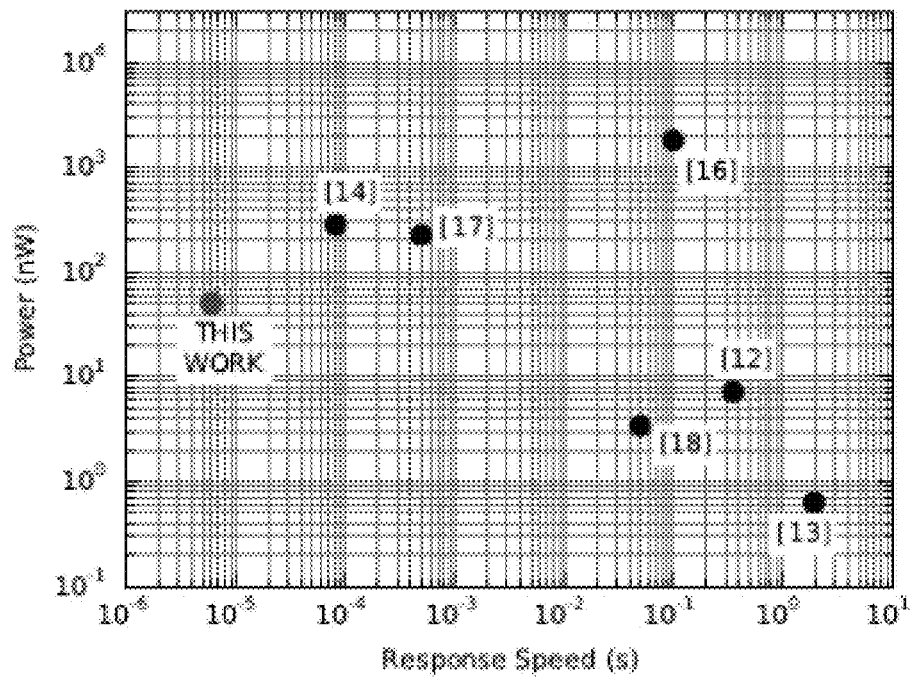
FIG. 14 is a graph of power-delay balance compared with the state of the art.

Broadly speaking, embodiments of the present techniques provide apparatus and methods for scaling supply voltage to sub/near threshold level and are useful to achieve minimum energy operation in processors for small, low-cost and energy efficient wireless networks. Present techniques provide improved balance between response speed and quiescent power as shown in FIG. 14.

According to a first technique there is provided a monitoring circuit comprising: sensing circuitry to sense a monitored signal having a plurality of operating signal states; a first comparator having a first input for receiving an upper threshold signal and a second comparator having a first input for receiving a lower threshold signal, the upper and lower threshold signals defining a range which includes at least one signal state of the plurality of operating states of the monitored signal, wherein the first and second comparators have a bias input for receiving a bias configuration setting, the bias configuration setting being selectable according to an operating signal state of the monitored signal.

In embodiments, the range includes at least one signal state of the plurality of operating states of the monitored signal and that signal state may be a safe operating signal state of the monitored signal. The safe operating signal state may be itself a voltage range determined by the design of the device being monitored.

Comparators may be controlled by the bias configuration setting which is operable to adjust at least one of a speed and power setting of the first or second comparator in response to an operating signal state of the monitored signal. The bias configuration setting may be controlled by bias current selection bits and may have a number of settings depending upon resolution, but typically the bias configuration setting has three bias settings and the bias settings may provide a range of comparator properties from faster response speed at higher quiescent power to slower response speed at lower quiescent power.

In embodiments, the first or second comparators may comprise a tail-gate current transistor being a thick gate oxide (TGO) device.

In embodiments, each of the first and second comparators have a second input to receive a signal indicative of the monitored signal.

In embodiments, a monitoring circuit may include a control circuit to receive an output signal from the first and second comparators and to generate a control signal responsive to the operating signal state of the monitored voltage, and the output signal may be asserted whenever the monitored signal is at a safe operating signal state of the monitored signal or the circuit may be designed to assert or not assert the signal at a given event.

Techniques provide that the monitoring signal is a varying voltage and the monitoring circuit is a voltage monitoring circuit. The circuit may be combined with a power management unit comprising a voltage regulator. A wireless sensor device may be under the control of a CPU system coupled to the power management unit.

According to a second aspect of present techniques, there is provided a method of monitoring a signal comprising: sensing a monitored signal having a plurality of operating signal states; receiving a first signal defining an upper threshold limit of a first comparator and receiving a second signal defining a lower threshold limit of a second comparator, the upper and lower threshold signals providing a range which includes at least one signal state of the plurality of operating states of the monitored signal; and selecting a bias configuration setting for a comparator, the bias configuration setting being selectable according to an operating signal state of the monitored signal.

In embodiments, the range includes a safe operating signal state of the monitored signal.

In embodiments, the method includes adjusting at least one of a speed and power setting of the first or second comparator in response to an operating signal state of the monitored signal.

In embodiments, the method includes receiving at a control circuit an output signal from the first and second comparators and so generating a control signal responsive to the operating signal state of the monitored voltage.

In embodiments, the method includes asserting the output signal whenever the monitored signal is at a safe operating signal state of the monitored signal.

In embodiments, the monitoring signal is a variable voltage signal.

In embodiments, the method provides a low power voltage monitoring scheme for minimum-energy sensor nodes comprising a method of monitoring a signal.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

The invention claimed is:

1. A monitoring circuit comprising:
   sensing circuitry to sense a monitored signal having a plurality of operating signal states;
   a first comparator having a first input and a second input, wherein the first input receives a first threshold signal, and wherein the second input receives a signal indicative of the monitored signal; and
   a second comparator having a first input and a second input, wherein the first input receives a second threshold signal that is different than the first threshold signal, wherein the second input receives the signal indicative of the monitored signal, and wherein the first and second threshold signals define a monitoring range that includes at least one signal state of the plurality of operating states of the monitored signal,
   wherein the first and second comparators have a control input for receiving a configuration setting, the configuration setting being selectable according to an operating signal state of the monitored signal.

2. The monitoring circuit of claim 1, wherein the monitoring range which includes the at least one signal state of the plurality of operating states of the monitored signal includes a desired operating signal state of the monitored signal.

3. The monitoring circuit of claim 1, wherein the configuration setting is operable to adjust at least one of a speed and power setting of the first or second comparator in response to the operating signal state of the monitored signal.

4. The monitoring circuit of claim 3, wherein the configuration setting is a bias configuration setting and controlled by bias current selection bits.

5. The monitoring circuit of claim 4, wherein the bias configuration setting has three or more bias settings.

6. The monitoring circuit of claim 5, wherein the three or more bias settings provide a range of comparator properties from faster response speed at higher quiescent power to slower response speed at lower quiescent power.

7. The monitoring circuit of claim 6, wherein the first or second comparators comprise a tail-gate current transistor being a thick gate oxide (TGO) device.

8. The monitoring circuit of claim 1, including a control circuit to receive an output signal from the first and second comparators and to generate a control signal responsive to the operating signal state of the monitored voltage.

9. The monitoring circuit of claim 8, wherein the output signal is asserted whenever the monitored signal is at the desired operating signal state of the monitored signal.

10. The monitoring circuit of claim 1, wherein the monitored signal is a variable voltage and the monitoring circuit is a voltage monitoring circuit.

11. A power management unit comprising a voltage regulator and a monitoring circuit comprising:
    sensing circuitry to sense a monitored signal having a plurality of operating signal states;
    a first comparator having a first input for receiving an upper threshold signal and a second input for receiving a signal indicative of the monitored signal; and
    a second comparator having a first input for receiving a lower threshold signal that is different than the upper threshold signal and a second input for receiving a signal indicative of the monitored signal, the upper and lower threshold signals defining a range which includes at least one signal state of the plurality of operating states of the monitored signal, wherein the first and second comparators have a control input for receiving a configuration setting, the configuration setting being selectable according to an operating signal state of the monitored signal.

12. The power management unit of claim 11, wherein the power management unit is configured to be coupled to a wireless sensor device comprising a CPU system.

13. A method of monitoring a signal comprising:
sensing a monitored signal with a first comparator and a second comparator, the monitored signal having a plurality of operating signal states;
receiving a first signal defining an upper threshold limit of the first comparator;
receiving a second signal that is different than the first signal, the second signal defining a lower threshold limit of the second comparator, the upper and lower threshold signals providing a range which includes at least one signal state of the plurality of operating states of the monitored signal; and
selecting a configuration setting for a comparator, the configuration setting being selectable according to an operating signal state of the monitored signal.

14. The method of claim 13, wherein the range which includes at least one signal state of the plurality of operating states of the monitored signal includes a desired operating signal state of the monitored signal.

15. The method of claim 14, further comprising adjusting at least one of a speed and power setting of the first or second comparator in response to the operating signal state of the monitored signal.

16. The method of claim 13, further comprising:
receiving at a control circuit an output signal from the first and second comparators; and
generating a control signal responsive to the operating signal state of the monitored voltage.

17. The method of claim 16, further comprising asserting the output signal whenever the monitored signal is at the desired operating signal state of the monitored signal.

18. The method of claim 13, wherein the monitored signal is a variable voltage signal.

19. The method of claim 13, wherein the method provides a low power voltage monitoring scheme for minimum-energy sensor nodes.

20. A circuit comprising:
a first comparator having a first positive input and a first negative input,
wherein the first positive input receives a regulated voltage associated with a monitored voltage signal; and
wherein the first negative input receives a first threshold voltage that defines an upper boundary of a monitored voltage range of the monitored voltage signal;
a second comparator having a second positive input and a second negative input,
wherein the second positive input receives the regulated voltage associated with the monitored voltage signal, and
wherein the second negative input receives a second threshold voltage that defines a lower boundary of the monitored voltage range of the monitored voltage signal; and
a sense voltage divider that receives the regulated voltage that is associated with the monitored voltage signal, generates a divided voltage by dividing the regulated voltage by a number, and provides the regulated voltage or the divided voltage as the regulated voltage to the first comparator and the second comparator based on a control input.

21. The circuit of claim 20, wherein the number is 2.

22. The circuit of claim 20, wherein the control input is selectable according to an operating signal state of the monitored voltage signal.

* * * * *